US011183455B2

(12) United States Patent
Motoyama et al.

(10) Patent No.: US 11,183,455 B2
(45) Date of Patent: Nov. 23, 2021

(54) INTERCONNECTS WITH ENLARGED CONTACT AREA

(71) Applicant: International Business Machines Corporation, Armonk, NY (US)

(72) Inventors: Koichi Motoyama, Clifton Park, NY (US); Oscar van der Straten, Guilderland Center, NY (US); Kenneth Chun Kuen Cheng, Albany, NY (US); Joseph F. Maniscalco, Lake Katrine, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/849,342

(22) Filed: Apr. 15, 2020

(65) Prior Publication Data

US 2021/0327803 A1 Oct. 21, 2021

(51) Int. Cl.
*H01L 23/522* (2006.01)
*H01L 23/528* (2006.01)
(Continued)

(52) U.S. Cl.
CPC .... *H01L 23/5226* (2013.01); *H01L 21/76816* (2013.01); *H01L 21/76831* (2013.01);
(Continued)

(58) Field of Classification Search
CPC ............. H01L 23/5226; H01L 23/5283; H01L 23/53238; H01L 23/53209;
(Continued)

(56) References Cited

U.S. PATENT DOCUMENTS 5,312,775 A * 5/1994 Fujii ................. H01L 23/53223
438/625
5,619,071 A * 4/1997 Myers ............... H01L 21/32133
257/753
(Continued)

FOREIGN PATENT DOCUMENTS

EP 3163605 A3 5/2017

OTHER PUBLICATIONS

Li, B. et al., "Impact of Via-Line Contact On Cu Interconnect Electromigration Performance," IEEE 05CH37616 43rd Annual International Reliability Physics Symposium, San Jose, 2005, 7 pages.
(Continued)

*Primary Examiner* — Zandra V Smith
*Assistant Examiner* — John M Parker
(74) *Attorney, Agent, or Firm* — Cantor Colburn LLP; Jeffrey S Labaw (57) ABSTRACT

An interconnect structure of an integrated circuit (IC) in which dielectric material defines upper and lower cavities and a via cavity communicative with the upper and lower cavities at upper and lower ends thereof. The interconnect structure includes first conductive material filling the upper and lower cavities to form upper and lower lines, respectively and second conductive material filling the via cavity from the upper end thereof to the lower end thereof to form a via electrically communicative with the upper and lower lines.

7 Claims, 7 Drawing Sheets

(51) Int. Cl.
*H01L 23/532* (2006.01)
*H01L 21/768* (2006.01)

(52) U.S. Cl.
CPC .. *H01L 21/76843* (2013.01); *H01L 21/76877* (2013.01); *H01L 23/5283* (2013.01); *H01L 23/53238* (2013.01)

(58) Field of Classification Search
CPC ......... H01L 21/76877; H01L 21/76843; H01L 21/76807; H01L 21/76831; H01L 21/76802; H01L 21/76834; H01L 21/76849; H01L 21/76816; H01L 21/76898
See application file for complete search history.

(56) References Cited

U.S. PATENT DOCUMENTS

| | | | | |
|---|---|---|---|---|
| 5,930,669 | A * | 7/1999 | Uzoh | H01L 23/5329 438/627 |
| 6,011,311 | A * | 1/2000 | Hsing | H01L 23/5226 257/741 |
| 6,548,905 | B2 * | 4/2003 | Park | H01L 21/76805 257/748 |
| 6,613,664 | B2 | 9/2003 | Barth et al. | |
| 6,706,629 | B1 | 3/2004 | Lin et al. | |
| 7,517,736 | B2 * | 4/2009 | Mehta | H01L 21/76843 438/128 |
| 8,749,064 | B2 | 6/2014 | Maekawa et al. | |
| 9,627,318 | B2 | 4/2017 | Lin et al. | |
| 9,704,806 | B2 | 7/2017 | Lin et al. | |
| 10,950,497 | B2 * | 3/2021 | Tsai | H01L 21/76877 |
| 2003/0160331 | A1 | 8/2003 | Fujisawa | |
| 2008/0079090 | A1 | 4/2008 | Hwang et al. | |
| 2016/0163587 | A1 | 6/2016 | Backes et al. | |
| 2017/0084486 | A1 | 3/2017 | Zopes et al. | |
| 2019/0371898 | A1 | 12/2019 | Huang | |

OTHER PUBLICATIONS

Motoyama, K. et al., "Discrete Study of ALD TaN on Via and Line for Low Resistive and High Reliable Cu/Low-k nterconnects and Other Applications," Oct. 10, 2012, ECS Journal of Solid State Science and Technology, vol. 1, No. 6, 8 pages.

* cited by examiner

FIG. 6H

INTERCONNECTS WITH ENLARGED CONTACT AREA

BACKGROUND

The present invention generally relates to interconnects. More specifically, the present invention relates to via interconnects with enlarged contact areas between vias and lines.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the IC often requires formation of multilevel or multilayered interconnect routing schemes, as well as various interconnect fabrication schemes such as, for example, single or dual damascene. Interconnect structures typically include copper or other similar conductors to enable high-speed signal transmission.

SUMMARY

Embodiments of the present invention are directed to an interconnect structure of an integrated circuit (IC) in which dielectric material defines upper and lower cavities and a via cavity communicative with the upper and lower cavities at upper and lower ends thereof. A non-limiting example of the interconnect structure includes first conductive material and second conductive material. The first conductive material fills the upper and lower cavities to form upper and lower lines, respectively. The second conductive material fills the via cavity from the upper end thereof to the lower end thereof to form a via electrically communicative with the upper and lower lines.

Embodiments of the present invention are directed to an interconnect structure of an integrated circuit (IC) in which dielectric material defines upper and lower cavities and a via cavity communicative with the upper and lower cavities at upper and lower ends thereof. A non-limiting example of the interconnect structure includes first conductive material and second conductive material. The first conductive material partially fills respective portions of the upper and lower cavities to form upper and lower lines, respectively, which are disposed at a distance from the via cavity. The second conductive material completely and continuously fills respective remaining portions of the upper and lower cavities and the via cavity from the upper end thereof to the lower end thereof to form an irregular barbell-shaped via electrically communicative with the upper and lower lines.

Embodiments of the invention are directed to a method of forming an interconnect structure of an integrated circuit (IC) in which dielectric material defines an upper cavity, a lower cavity that is lined and capped with a remainder thereof filled with a first conductive material and a via cavity communicative with the upper and lower cavities. A non-limiting example of the method includes lining the upper cavity and the via cavity, removing the first conductive material from a portion of the first cavity, filling the portion of the lower cavity and an entirety of the via cavity with a second conductive material, partially filling the upper cavity with the second conductive material and filling a remaining portion of the upper cavity with the first conductive material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, as ICs are developed to have back-end-of-line (BEOL) pitches below about 30 nm, these ICs can also have resistance-capacitance (RC) delays that grow unsustainably large. Also, these and other types of ICs can exhibit copper fill and reliability issues. Therefore, to alleviate at least these concerns, copper interconnects with cobalt via-prefills have been proposed in which cobalt is pre-filled into a via cavity before a remainder of the via cavity is filled with copper.

Where copper interconnects with cobalt via-prefills have been incorporated into certain ICs, it has been observed that copper in the line below the via with the cobalt pre-fill can, in some cases, diffuse into surrounding low-k dielectric material through the cobalt because the cobalt is typically not surrounded by a barrier metal. It has also been observed that copper interconnects with cobalt via pre-fills can exhibit excessive resistance characteristics owing to relatively small contact areas between the cobalt pre-fills and overlying copper as well as certain electro-magnetic (EM) performance issues that arise due to voids being created in the overlaying copper where the overlying copper has a relatively high aspect ratio.

Turning now to an overview of the aspects of the invention, one or more embodiments of the invention address the above-described shortcomings of the prior art by provided a structure in which copper lines are connected by via interconnects. The structure has enlarged contact areas between vias and corresponding lines and does not include barrier metal provided at bottom regions or sections of the via interconnects.

The above-described aspects of the invention address the shortcomings of the prior art by providing for a structure in which copper lines are connected by via interconnections that does not exhibit copper diffusion into surrounding low-k dielectric material. The structure has large contact areas between upper and lower lines and vias and thus exhibits reduced resistance characteristics and does not suffer from void creation that might otherwise lead to EM performance issues. The reduced resistance characteristics are further enhanced by the increased total volume of the via interconnections.

Figure 1:
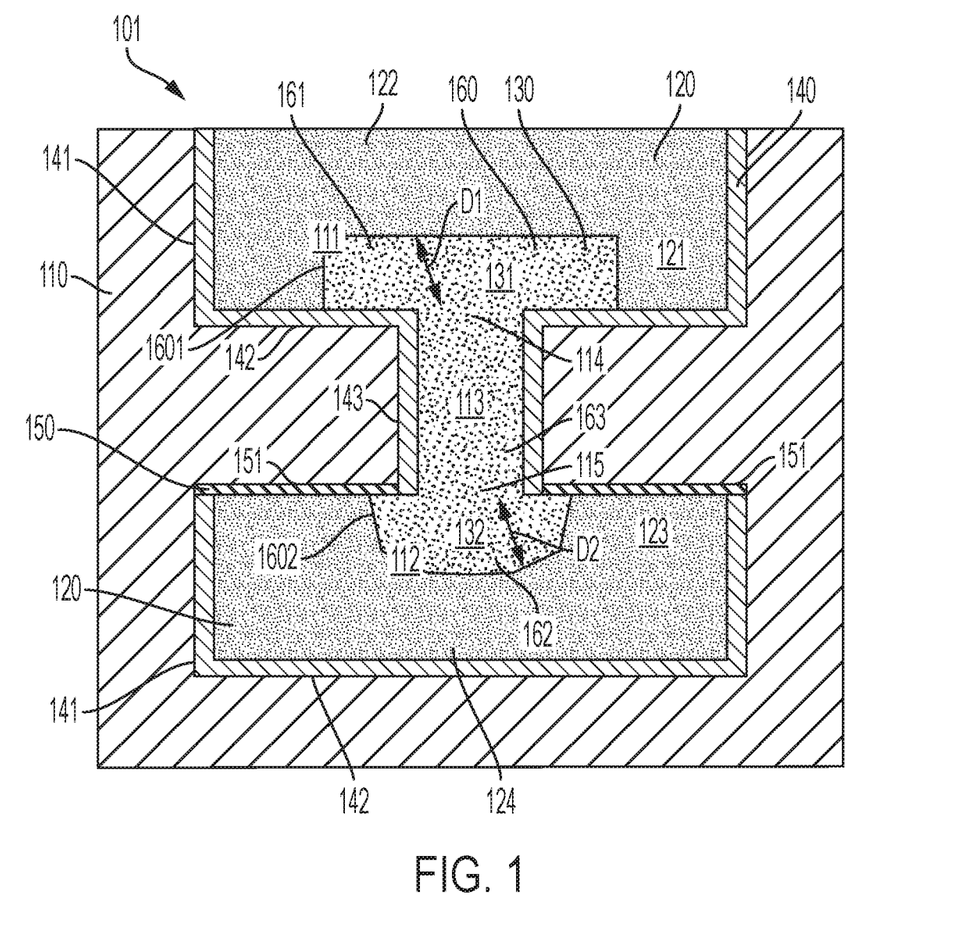
FIG. 1 is a side view of an interconnect structure of an integrated circuit (IC) in accordance with one or more embodiments of the present invention.

Turning now to a more detailed description of aspects of the present invention, FIG. 1 is a side view of an interconnect structure 101 of an (IC) including dielectric material 110. The interconnect structure 101 includes first conductive material 120 and second conductive material 130. The interconnect structure 101 further includes barrier metal 140 and a dielectric cap 150.

Figure 3A:
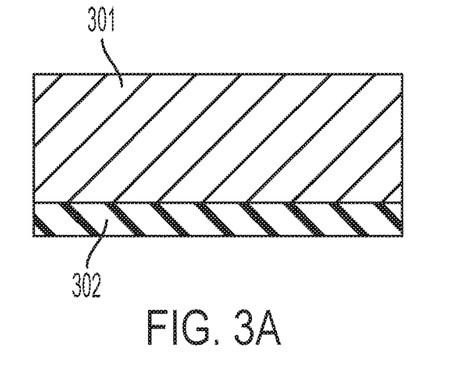
FIGS. 3A-3L depict a graphical flow illustrating the method of forming the interconnect structure of FIG. 2 in accordance with one or more embodiments of the present invention.
Figure 3B:
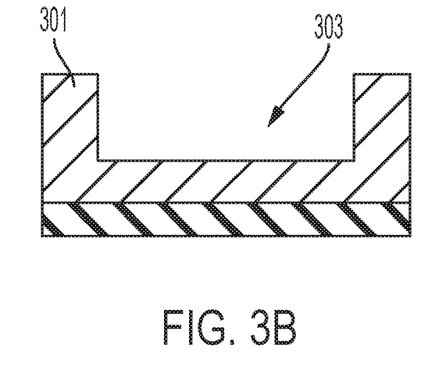
Figure 3C:
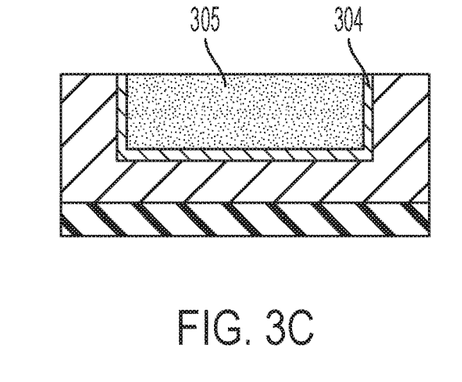
Figure 3D:
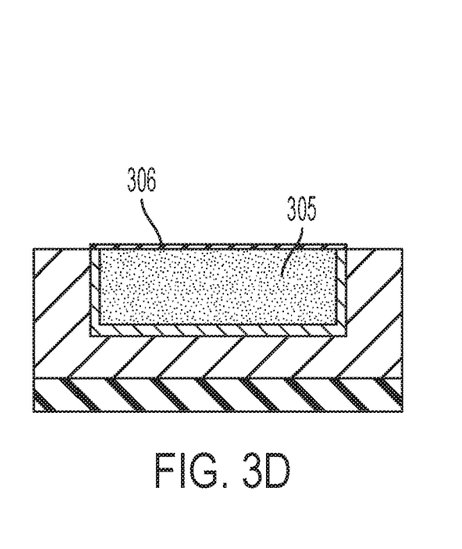
Figure 3E:
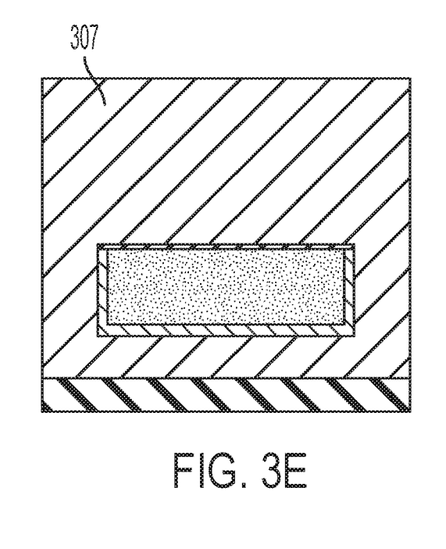
Figure 3F:
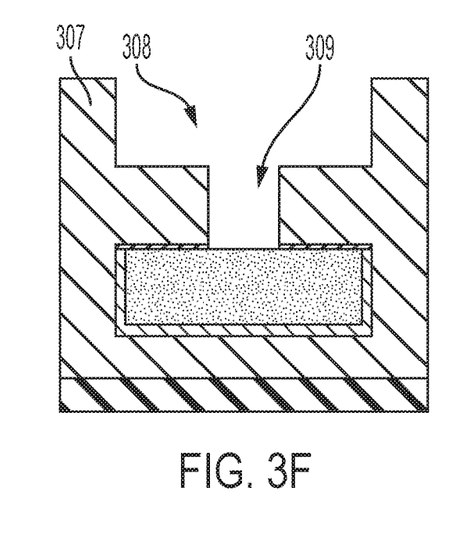
Figure 3G:
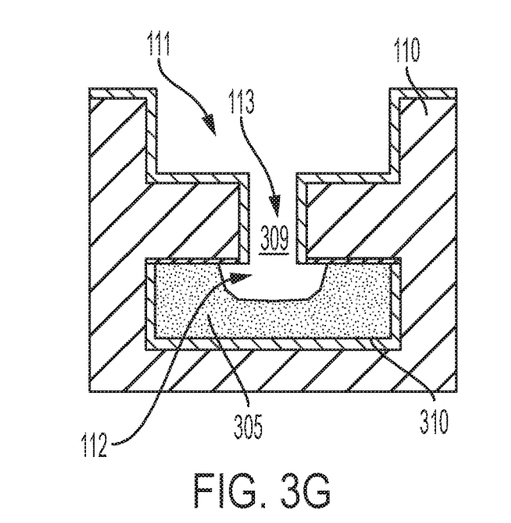

The dielectric material 110 can include or be provided as low-k dielectric material and is formed to define an upper cavity 111 that extends from an uppermost surface of the dielectric material 110, a lower cavity 112 and a via cavity 113 (see FIG. 3G). The via cavity 113 has an upper end 114 that is communicative with a lower portion of the upper cavity 111 and a lower end 115 that is communicative with an upper portion of the lower cavity 112. The barrier metal 140 can include or be provided as tantalum nitride that has been deposited by area selective atomic layer deposition (ALD) or other similar processes and lines respective sidewalls 141 and respective lower surfaces 142 of the upper cavity 111 and the lower cavity 112 as well as sidewalls 143 of the via cavity 113. The dielectric cap 150 can be disposed along or to line or cap an upper surface 151 of the lower cavity 112.

The first conductive material 120 can include or be provided as copper or another similar material and partially fills a portion 121 of the upper cavity 111, which is not occupied by the barrier metal 140, to form an upper line 122 (the portion 121 of the upper cavity 111 is illustrated in FIG. 1 to represent the fraction of the upper cavity 111 that is occupied by the first conductive material 120). The upper line 122 is disposed at a distance D1 from the upper end 114 of the via cavity 113. The first conductive material 120 also partially fills a portion 123 of the lower cavity 112, which is not occupied by the barrier metal 140 or the dielectric cap 150, to form a lower line 124 (the portion 123 of the lower cavity 112 is illustrated to represent the fraction of the lower cavity 112 that is occupied by the first conductive material 120). The lower line 124 is disposed at a distance D2 from the lower end 115 of the via cavity 113.

While the first conductive material 120 is illustrated with a similar cross-hatching in FIG. 1, is it to be understood that the first conductive material 120 making up the upper line 122 can be the same or different than the first conductive material 120 making up the lower line 124. These same or different first conductive materials 120 can have certain similar properties, such as electrical conductivities and can be worked and reworked using similar processes.

It is to be further understood that the first and second conductive materials 120 and 130 can both differ from each other and from the barrier metal 140.

The second conductive material 130 can include or be provided as one or more of cobalt, ruthenium, tungsten, rhodium and iridium or another similar material. The second conductive material 130 completely and continuously fills a remaining portion 131 of the upper cavity 111, which is not filled by the first conductive material 120 and which is not occupied by the barrier metal 140, a remaining portion 132 of the lower cavity 112, which is not filled by the first conductive material 120 and which is not occupied by the barrier metal 140 or the dielectric cap 150, and a remaining portion of the via cavity 113 that is not occupied by the barrier metal 140 from the upper end 114 to the lower end 115. The complete and continuous fill of the second conductive material 130 results in the second conductive material 130 forming an irregular barbell-shaped via 160 that is electrically communicative with the upper line 122 and with the lower line 124.

In accordance with one or more embodiments of the present invention, the irregular barbell-shaped via 160 includes an upper section 161, a lower section 162 and a central section 163. The upper section 161 can have a regular polygonal shape and is disposed in the remaining portion 131 of the upper cavity 111 to completely and entirely traverse the space therein across the distance D1. The lower section 162 can have an irregular or convex shape and is disposed in the remaining portion 132 of the lower cavity 112 to completely and entirely traverse the space therein across the distance D2. The central section 163 is disposed in the remaining portion of the via cavity 113 to be electrically communicative with the upper section 161 and the lower section 162.

Due to the presence of the barrier metal 140 and the dielectric cap 150, there is no possibility of the first conductive material 120 (or the second conductive material 130) diffusing into the dielectric material 110. Also, there is an absence of barrier metal of any kind between the irregular barbell-shaped via 160 and the lower line 112 or the upper line 111 such that all contact areas 1601 and 1602 between the irregular barbell-shaped via 160 and each of the upper line 111 and the lower line 112, respectively, are characterized in that the second conductive material 130 is directly and immediately adjacent to and directly abuts with the first conductive material 120. In addition, the contact areas 1601 and 1602 between the irregular barbell-shaped via 160 and each of the upper line 111 and the lower line 112, respectively, are larger than a minimal cross-sectional area of the irregular barbell-shaped via 160 (i.e., the cross-sectional area of the central section 163 of the irregular barbell-shaped via 160) to thus provide for improved and more reliable electrical connections.

In addition, respective minimal aspect ratios of the first conductive material 120 in each of the upper line 122 and the lower line 124 are less than a maximal aspect ratio of the second conductive material 130 in the irregular barbell-shaped via 160. As such, and particularly to an extent the first conductive material 120 is copper or another similar material, there are an absence of voids created in either of the upper line 122 or the lower line 124.

Figure 2:
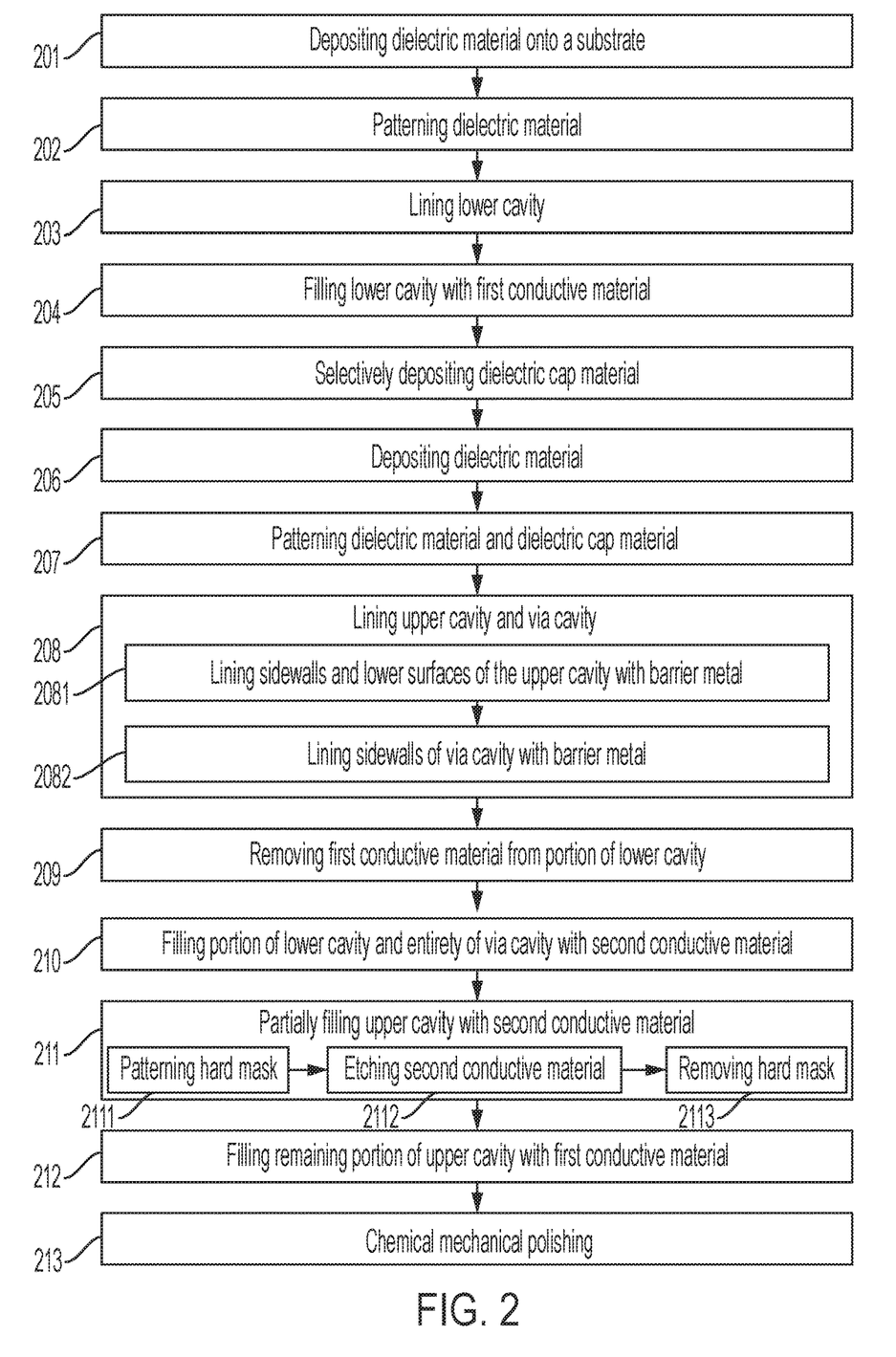
FIG. 2 is a schematic flow diagram illustrating a method of forming an interconnect structure of an integrated circuit (IC) in accordance with one or more embodiments of the present invention.

With reference to FIG. 2, a method of forming an interconnect structure, such as the interconnect structure 101 of FIG. 1, is provided. As shown in FIG. 2, the method includes depositing dielectric material onto a substrate 201, patterning the dielectric material 202 to define a lower cavity, lining the lower cavity with barrier metal 203, filling a remainder of the lower cavity with a first conductive material 204, where the first conductive material includes copper or another similar material, and selectively depositing dielectric cap material 205 to form a dielectric cap over the lower cavity. The method further includes depositing dielectric material onto the dielectric material deposited previously and the dielectric cap 206 and patterning the dielectric material and the dielectric cap to define an upper cavity and a via cavity that extends from the upper cavity to the first conductive material 207.

In addition, the method includes lining the upper cavity and the via cavity 208 by lining sidewalls and lower surfaces of the upper cavity with barrier metal 2081 and lining sidewalls of the via cavity with the barrier metal 2082 and removing the first conductive material from a portion of the first cavity 209 by etching, for example. The method also includes filling the portion of the lower cavity and an entirety of the via cavity with a second conductive material 210 and partially filling the upper cavity with the second conductive material 211 by chemical vapor deposition or another suitable process, where the second conductive material can include or be provided as one or more of cobalt, ruthenium, tungsten, rhodium and iridium or another similar material. The partially filling of the upper cavity with the second conductive material of operation 211 can include patterning a hard mask onto the second conductive material 2111, etching the second conductive material around the hard mask 2112 and removing the hard mask 2113.

In addition, the method includes filling a remaining portion of the upper cavity with the first conductive material 212 and chemical mechanical polishing or another suitable process 213 to planarize the first conductive material in the upper cavity.

With reference to FIGS. 3A-3L, the method of forming the interconnect structure 101 of FIG. 2 is illustrated graphically.

As shown in FIGS. 3A, 3B and 3C, dielectric material 301 is deposited into a substrate 302, whereupon the dielectric material 301 is patterned to form a lower cavity 303, which is lined with barrier metal 304 and filled with first conductive material 305.

As shown in FIGS. 3D, 3E and 3F, the lower cavity 303 is capped with a dielectric cap 306. Additional dielectric material 307 is then deposited over the dielectric material 301 and the dielectric cap 306 and this additional dielectric material 307 and the dielectric cap 306 are patterned (see FIG. 3F) to define an upper cavity 308 and a via cavity 309 that is communicative with the upper cavity 308 and the lower cavity 303.

Figure 3H:
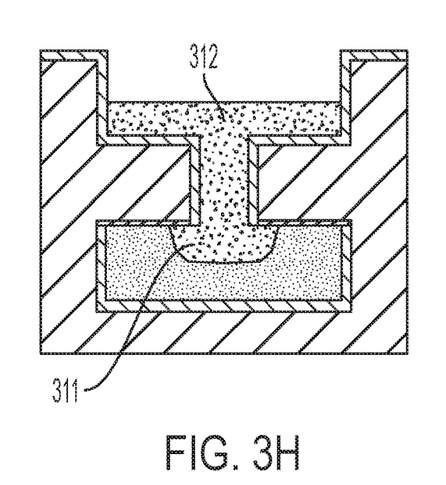

As shown in FIG. 3G (which illustrates the upper cavity 111, the dielectric material 110, the lower cavity 112 and the via cavity 113 mentioned above in connection with FIG. 1), the first conductive material 305 (e.g., copper or another similar material) is etched (e.g., wet isotropic etching or another suitable process) away from the via cavity 309 to form a lower line 310. At this point, as shown in FIG. 3H, second conductive material 311 (e.g., one or more of cobalt, ruthenium, tungsten, rhodium and iridium or another similar material) is filled in the open portion in the lower cavity 303, the entirety of the via cavity 309 and a lower portion of the upper cavity 308 (by, e.g., chemical vapor deposition or another suitable process) to form a via 312.

Figure 3I:
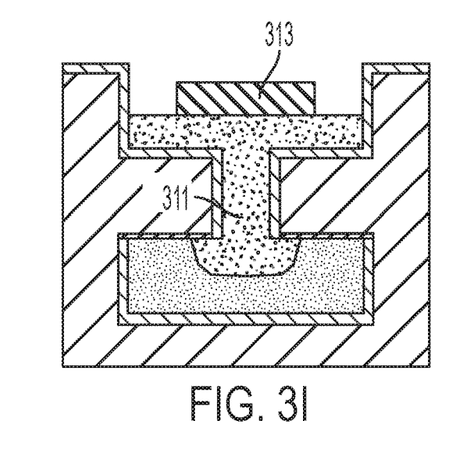
Figure 3J:
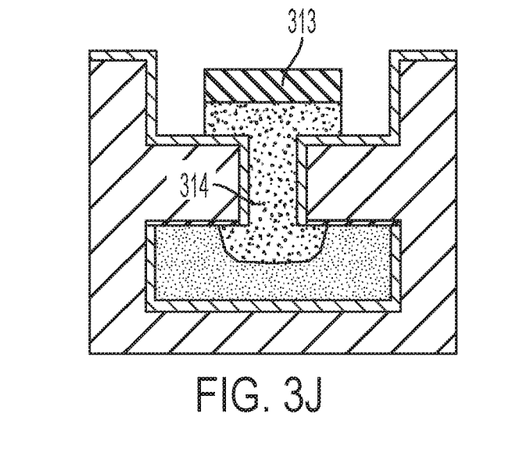
Figure 3K:
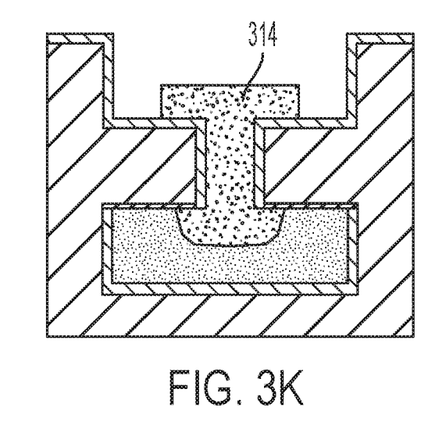

As shown in FIGS. 3I, 3J and 3K, a hard mask 313 is formed on the second conductive material 311 in the upper cavity 308 whereupon the second conductive material 311 in the upper cavity 308 is etched around the hard mask 313 to form the via 312 into an irregular barbell-shaped via 314 and, subsequently, the hard mask 313 is removed.

Figure 3L:
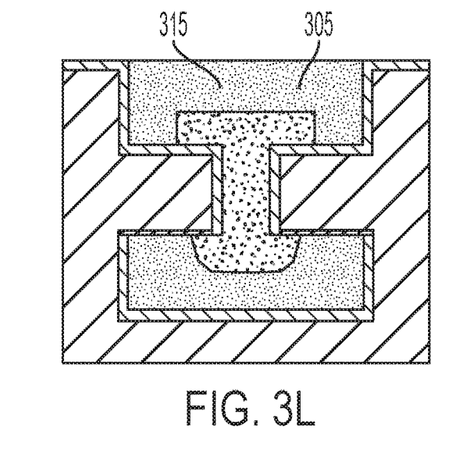

As shown in FIG. 3L, the first conductive material 305 is filled into the remaining open space in the upper cavity 308 to form an upper line 315. The upper line 315 is then planarized (by, e.g., chemical mechanical polishing or another suitable process).

Figure 4:
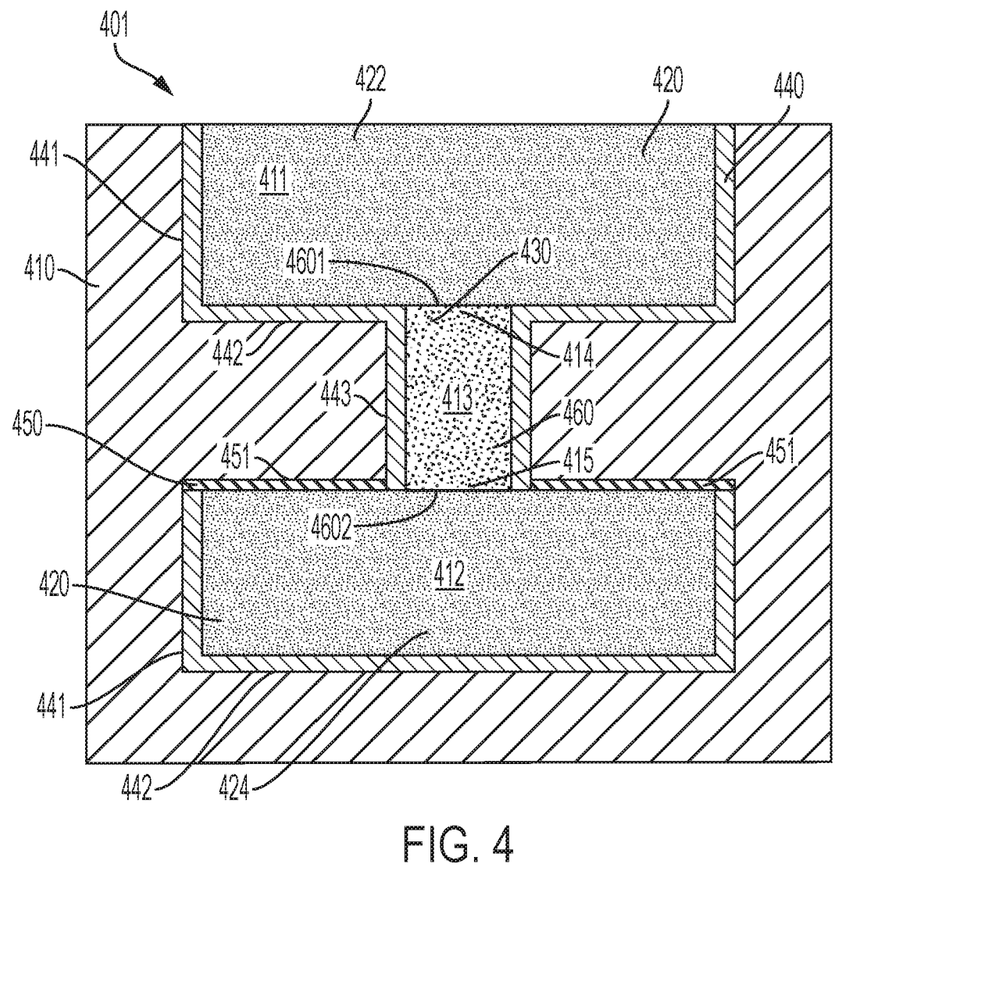
FIG. 4 is a side view of an interconnect structure of an integrated circuit (IC) in accordance with one or more embodiments of the present invention.

With reference to FIG. 4, an interconnect structure 401 of an IC including dielectric material 410 is provided. The interconnect structure 401 includes first conductive material 420 and second conductive material 430. The interconnect structure 401 further includes barrier metal 440 and a dielectric cap 450.

Figure 6A:
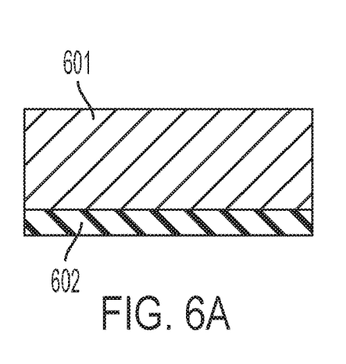
FIGS. 6A-6H depict a graphical flow illustrating the method of forming the interconnect structure of FIG. 5 in accordance with one or more embodiments of the present invention.
Figure 6B:
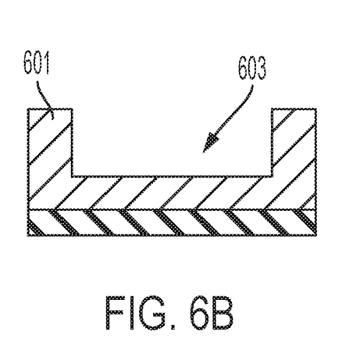
Figure 6C:
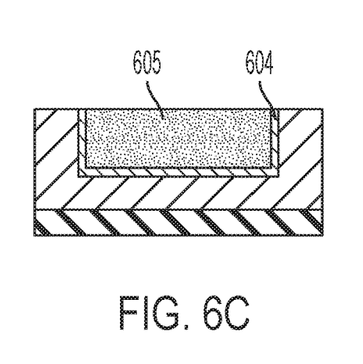
Figure 6D:
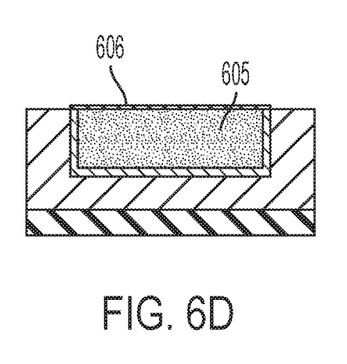
Figure 6E:
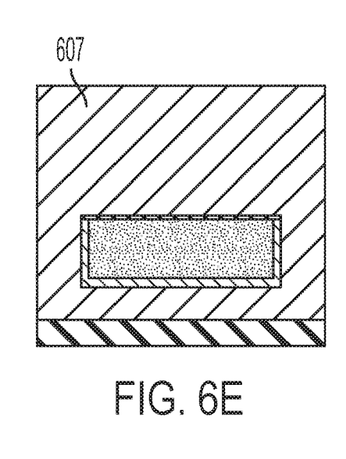
Figure 6F:
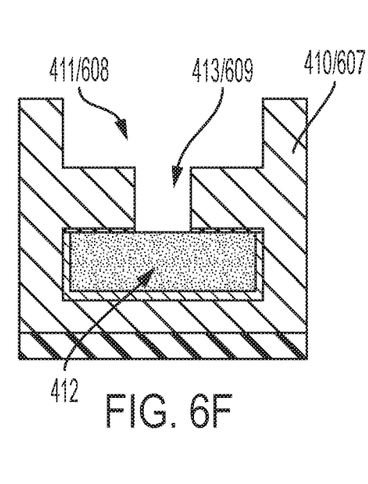

The dielectric material 410 can include or be provided as low-k dielectric material and is formed to define an upper cavity 411 that extends from an uppermost surface of the dielectric material 410, a lower cavity 412 and a via cavity 413 (see FIG. 6F). The via cavity 413 has an upper end 414 that is communicative with a lower portion of the upper cavity 411 and a lower end 415 that is communicative with an upper portion of the lower cavity 412. The barrier metal 440 can include or be provided as tantalum nitride that has been deposited by area selective atomic layer deposition (ALD) or other similar processes and lines respective sidewalls 441 and respective lower surfaces 442 of the upper cavity 411 and the lower cavity 412 as well as sidewalls 443 of the via cavity 413. The dielectric cap 450 can be disposed along or to line or cap an upper surface 451 of the lower cavity 412.

The first conductive material 420 can include or be provided as copper or another similar material and fills an entirety of the upper cavity 411, which is not occupied by the barrier metal 440, to form an upper line 422. The upper line 422 is immediately adjacent to the upper end 414 of the via cavity 413. The first conductive material 420 also fills an entirety of the lower cavity 412, which is not occupied by the barrier metal 440 or the dielectric cap 450, to form a lower line 424. The lower line 424 is immediately adjacent to the lower end 415 of the via cavity 413.

While the first conductive material 420 is illustrated with a similar cross-hatching in FIG. 1, is it to be understood that the first conductive material 420 making up the upper line 422 can be the same or different than the first conductive material 420 making up the lower line 424. These same or different first conductive materials 420 can have certain similar properties, such as electrical conductivities and can be worked and reworked using similar processes.

The second conductive material 430 can include or be provided as one or more of cobalt, ruthenium, tungsten, rhodium and iridium or another similar material. The second conductive material 430 completely and continuously fills a remaining portion of the via cavity 413 that is not occupied by the barrier metal 440 from the upper end 414 to the lower end 415. The complete and continuous fill of the second conductive material 430 results in the second conductive material 430 forming a via 460 that is electrically communicative with the upper line 422 and with the lower line 424.

Due to the presence of the barrier metal 440 and the dielectric cap 450, there is no possibility of the first conductive material 420 (or the second conductive material 430) diffusing into the dielectric material 410. Also, there is an absence of barrier metal of any kind between the via 460 and the lower line 412 or the upper line 411 such that all contact areas 4601 and 4602 between the via 460 and each of the upper line 411 and the lower line 412, respectively, are characterized in that the second conductive material 430 is directly and immediately adjacent to and directly abuts with the first conductive material 420. In addition, the contact areas 4601 and 4602 between the via 460 and each of the upper line 411 and the lower line 412, respectively, are at least as large as a minimal cross-sectional area of the via 460 to thus provide for improved and more reliable electrical connections.

In addition, respective minimal aspect ratios of the first conductive material 420 in each of the upper line 422 and the lower line 424 are less than a maximal aspect ratio of the second conductive material 430 in the via 460. As such, and particularly to an extent the first conductive material 420 is copper or another similar material, there are an absence of voids created in either of the upper line 422 or the lower line 424.

It is to be further understood that the first and second conductive materials 420 and 430 can both differ from each other and from the barrier metal 440.

Figure 5:
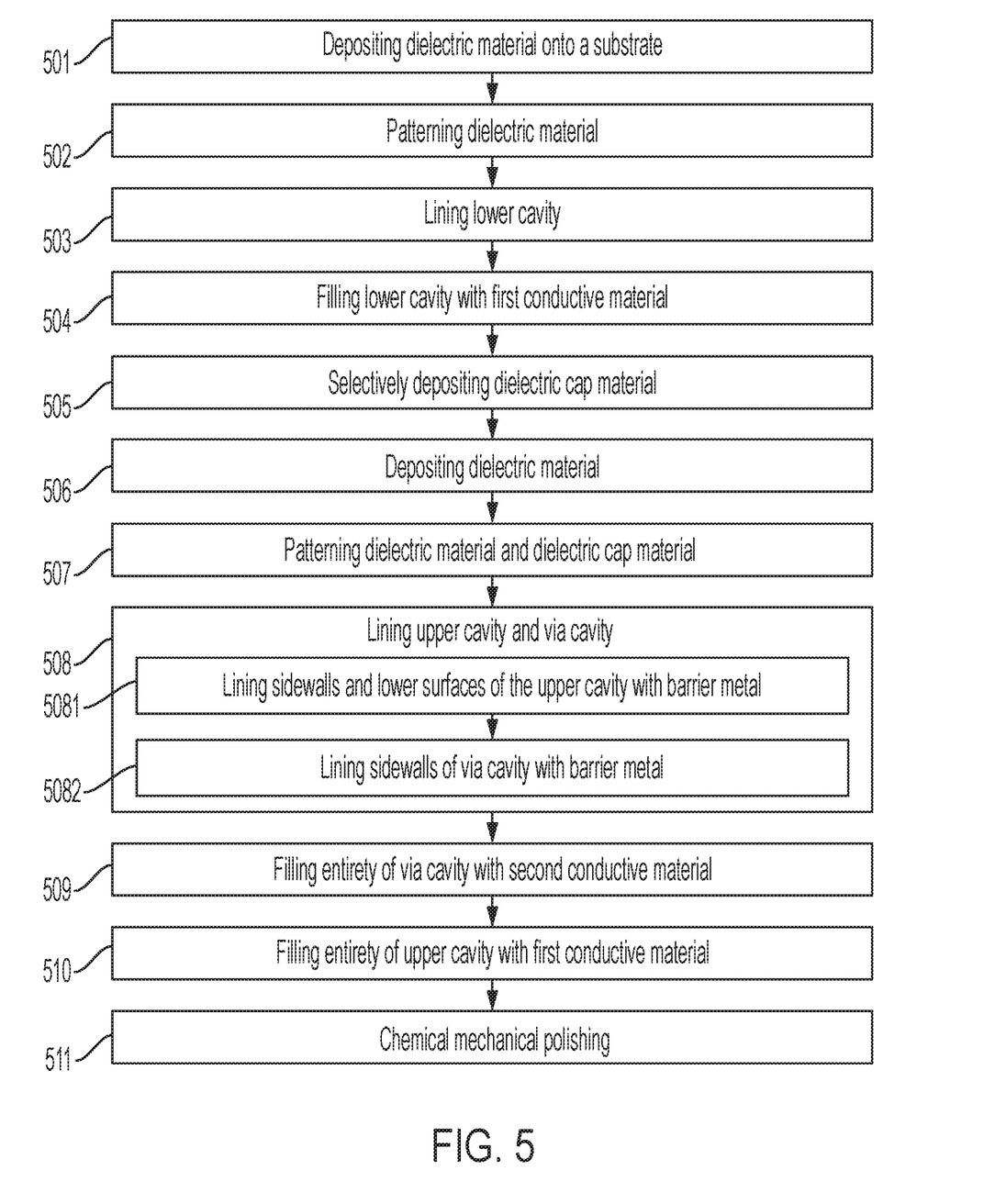
FIG. 5 is a schematic flow diagram illustrating a method of forming an interconnect structure of an integrated circuit (IC) in accordance with one or more embodiments of the present invention.

With reference to FIG. 5, a method of forming an interconnect structure, such as the interconnect structure 401 of FIG. 4, is provided. As shown in FIG. 5, the method includes depositing dielectric material onto a substrate 501, patterning the dielectric material 502 to define a lower cavity, lining the lower cavity with barrier metal 503, filling a remainder of the lower cavity with a first conductive material 504, where the first conductive material includes copper or another similar material, and selectively depositing dielectric cap material 505 to form a dielectric cap over the lower cavity. The method further includes depositing dielectric material onto the dielectric material deposited previously and the dielectric cap 506 and patterning the dielectric material and the dielectric cap to define an upper cavity and a via cavity that extends from the upper cavity to the first conductive material 507.

In addition, the method includes lining the upper cavity and the via cavity 508 by lining sidewalls and lower surfaces of the upper cavity with barrier metal 5081 and lining sidewalls of the via cavity with the barrier metal 5082.

The method also includes filling an entirety of the via cavity with a second conductive material 509 by chemical vapor deposition or another suitable process, where the second conductive material can include or be provided as one or more of cobalt, ruthenium, tungsten, rhodium and iridium or another similar material, and filling an entirety of the upper cavity with the first conductive material 510 and chemical mechanical polishing or another suitable process 511 to planarize the first conductive material in the upper cavity.

With reference to FIGS. 6A-6H, the method of forming the interconnect structure 401 of FIG. 5 is illustrated graphically.

As shown in FIGS. 6A, 6B and 6C, dielectric material 601 is deposited into a substrate 602, whereupon the dielectric material 601 is patterned to form a lower cavity 603, which is lined with barrier metal 604 and filled with first conductive material 605.

As shown in FIGS. 6D, 6E and 6F, the lower cavity 603 is capped with a dielectric cap 606. Additional dielectric material 607 is then deposited over the dielectric material 601 and the dielectric cap 606 and this additional dielectric material 607 and the dielectric cap 606 are patterned to define an upper cavity 608 and a via cavity 609 that is communicative with the upper cavity 608 and the lower cavity 603.

Figure 6G:
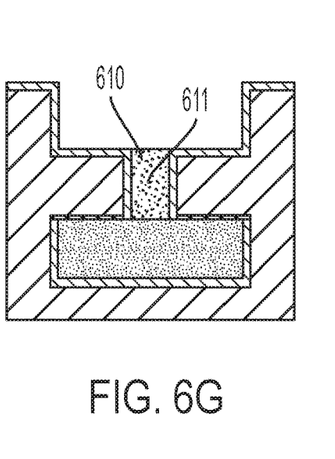

As shown in FIG. 6G, second conductive material 610 (e.g., one or more of cobalt, ruthenium, tungsten, rhodium and iridium or another similar material) is filled in the entirety of the via cavity 609 (by, e.g., chemical vapor deposition or another suitable process) to form a via 610.

Figure 6H:
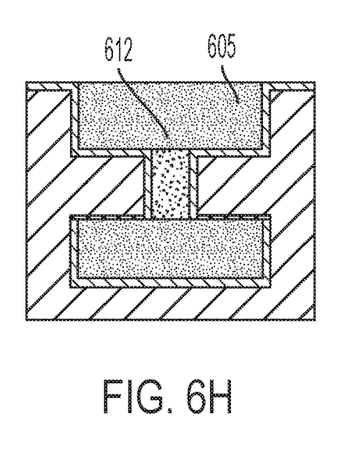

As shown in FIG. 6H, the first conductive material 605 is filled in the entirety of the upper cavity 608 to form an upper line 612. The upper line 612 is then planarized (by, e.g., chemical mechanical polishing or another suitable process).

It is to be understood that the barbell-shaped via 160 of FIG. 1 and to a similar extent the structure of FIG. 4 can have various alternative shapes, sizes and dimensions in both cross-sectional and three-dimensional perspectives. For example, the upper section 161 and the lower section 162 of the barbell-shaped via 160 of FIG. 1 could be different shapes such as, but not limited to, extended cylinders and can have radial symmetry or asymmetry and still have an increased surface area. Where there is an undercut in the lower section 162, the overall structure of the barbell-shaped via 160 can have additional features that insure full and reliable electrical connections. For example, the central section 163 can be tapered outwardly with increasing depth to limit an amount or degree of undercutting that is required.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an interconnect structure of an integrated circuit (IC), the method comprising:
    defining, in dielectric material, an upper cavity, a lower cavity and a via cavity communicative with the upper cavity and the lower cavity;
    lining sidewalls and lower surfaces of the lower cavity;
    capping an upper surface of the lower cavity;
    filling a remainder of the lower cavity with a first conductive material;
    lining the upper cavity and the via cavity;
    removing the first conductive material from a portion of the lower cavity;
    filling the portion of the lower cavity and an entirety of the via cavity with a second conductive material;
    partially filling the upper cavity with the second conductive material; and
    filling a remaining portion of the upper cavity with the first conductive material.

2. The method according to claim 1, wherein the first conductive material comprises copper and the second conductive material comprises one or more of cobalt, ruthenium, tungsten, rhodium and iridium.

3. The method according to claim 1, wherein the lining of the upper cavity comprises:
    lining sidewalls and lower surfaces of the upper cavity with barrier metal; and
    lining sidewalls of the via cavity with the barrier metal.

4. The method according to claim 1, wherein the removing of the first conductive material from the portion of the lower cavity comprises etching.

5. The method according to claim 1, wherein the filling of the portion of the lower cavity and the entirety of the via cavity with the second conductive material and the partially filling of the upper cavity with the second conductive material each comprise chemical vapor deposition.

6. The method according to claim 1, wherein the partially filling of the upper cavity with the second conductive material comprises:
    patterning a hard mask onto the second conductive material;
    etching the second conductive material around the hard mask; and
    removing the hard mask.

7. The method according to claim 1, wherein the filling of the remaining portion of the upper cavity with the first conductive material comprises chemical mechanical polishing.

* * * * *